(12) United States Patent
 Abergel et al.

(10) Patent No.: US 11,645,490 B2
(45) Date of Patent: May 9, 2023

(54) METHOD FOR MANUFACTURING PERSONALIZED CHIPLESS RADIOFREQUENCY IDENTIFICATION ("RFID") DEVICES

(71) Applicants: MGI DIGITAL TECHNOLOGY, Fresnes (FR); INKJET ENGINE TECHNOLOGY, Meudon (FR)

(72) Inventors: Edmond Abergel, Paris (FR); Louis Gautier Le Boulch, Meudon (FR)

(73) Assignees: MGI DIGITAL TECHNOLOGY, Fresnes (FR); INKJET ENGINE TECHNOLOGY, Meudon (FR)

( * ) Notice: Subject to any disclaimer, the term of this patent is extended or adjusted under 35 U.S.C. 154(b) by 18 days.

(21) Appl. No.: 16/971,093

(22) PCT Filed: Mar. 6, 2019

(86) PCT No.: PCT/EP2019/055532
 § 371 (c)(1),
 (2) Date: Aug. 19, 2020

(87) PCT Pub. No.: WO2019/170726
 PCT Pub. Date: Sep. 12, 2019

(65) Prior Publication Data
 US 2020/0394490 A1    Dec. 17, 2020

(30) Foreign Application Priority Data
 Mar. 8, 2018  (EP) ..................................... 18305249

(51) Int. Cl.
 *G06K 19/06*   (2006.01)
 *G06K 19/077*  (2006.01)
 (Continued)

(52) U.S. Cl.
 CPC ..... *G06K 19/07722* (2013.01); *H05K 1/0242* (2013.01); *H05K 1/0298* (2013.01); *H05K 3/12* (2013.01); *H05K 2201/10098* (2013.01)

(58) Field of Classification Search
 CPC ............. H05K 3/046; H05K 2203/122; H05K 2203/013; G06K 19/0723
 (Continued)

(56) References Cited

U.S. PATENT DOCUMENTS 5,250,758 A    10/1993  Fjelstad et al.
8,736,452 B1 *  5/2014  Varahramyan ..... G06K 19/0672
                                                340/572.7

(Continued)

FOREIGN PATENT DOCUMENTS

CA    2089060 A1   8/1994
EP    0045466 A2   2/1982
 (Continued)

OTHER PUBLICATIONS

Notification of Transmittal of the International Search Report and the Written Opinion of the International Searching Authority, or the Declaration dated May 16, 2019 in related International Application No. PCT/EP2019/055532.

*Primary Examiner* — Daniel St Cyr
(74) *Attorney, Agent, or Firm* — Maschoff Brennan

(57) ABSTRACT

The present invention relates to a method for producing radio frequency identification devices (RFID) without personalized chip, in particular the production of RFID tags without personalized chip, also referred to as chipless RFID tags. The present invention also relates to devices and labels produced by the claimed method as well as to systems for producing said devices/labels.

18 Claims, 2 Drawing Sheets

(51) Int. Cl.
*H05K 1/02* (2006.01)
*H05K 3/12* (2006.01)

(58) Field of Classification Search
USPC .................................. 235/492, 387, 462.46
See application file for complete search history.

(56) References Cited

U.S. PATENT DOCUMENTS

| | | | |
|---|---|---|---|
| 9,640,855 B1* | 5/2017 | Gibson | ................ H01Q 1/2225 |
| 2007/0102103 A1 | 5/2007 | Ku | |
| 2009/0128290 A1 | 5/2009 | Chopra et al. | |
| 2013/0206846 A1* | 8/2013 | Wilkinson | ....... G06K 19/07767 |
| | | | 235/492 |
| 2014/0144994 A1* | 5/2014 | Conner | .................. G01N 19/10 |
| | | | 235/492 |
| 2017/0330066 A1* | 11/2017 | Gibson | ............. G08B 13/2417 |

FOREIGN PATENT DOCUMENTS

| | | | | |
|---|---|---|---|---|
| EP | 0414362 A2 | 2/1991 | | |
| EP | 2056656 A2 | 5/2009 | | |
| JP | 2017211873 | * 11/2017 | ........... G06K 19/067 |

* cited by examiner

METHOD FOR MANUFACTURING PERSONALIZED CHIPLESS RADIOFREQUENCY IDENTIFICATION ("RFID") DEVICES

The present invention relates to a method for manufacturing personalized chipless radiofrequency identification ("RFID") devices, in particular to the manufacture of personalized chipless RFID tags. The present invention also relates to the devices and tags able to be manufactured using the claimed method, to the use of the method for manufacturing chipless radiofrequency identification devices, and to the systems for manufacturing said devices/tags.

"Device" should be understood to mean a package, a document, a tag, in particular a security document, and possibly any object on which it is possible to produce the chipless RFID identification marker or to which a medium for the marker is able to be attached.

BACKGROUND

Data transmission systems using radiofrequency identification technology are commonly used to identify all types of objects and living beings (for example an animal or a human) carrying or wearing a suitable device (tag). RFID technology has in recent decades become increasingly widespread as a device for storing and transmitting information.

This RFID technology uses a radio tag, also called a transponder (a contraction of the terms "transmitter" and "responder"), which is placed on an object, and a reader, also called an interrogator, for reading and identifying the radio tag. RFID technologies are generally classified into categories using "active" or "passive" radio tags. Active radio tags have a local energy source (such as a battery) by virtue of which they send a signal to the reader; they are thus generally characterized by a relatively long transmitted signal range. On the other hand, passive radio tags do not have an internal power source because their signal transmission energy comes from the reader itself, and in particular from the reception of the signal transmitted by the reader; thus, passive radio tags have a much smaller signal range, generally less than 8 meters.

From a practical point of view, RFID technology uses radio frequencies that have material penetration characteristics that are much higher than optical signals. Thus, in comparison with barcode tags, RFID technology will allow use in much more hostile environmental conditions; for example, RFID tags may be read through any kind of material such as paper, cardboard, wood, paint, water, dirt, dust, an animal or human body, concrete or even through the tagged item itself or its packaging. This has opened up a wide range of applications to RFID tags, among which mention may be made, by way of illustration, of the identification of goods and people, in particular of packages, automobiles (parking, tolls, etc.), inventory management, electronic access cards, not to mention all kinds of security documents such as for example a payment means, such as a banknote, a check or a luncheon voucher, an identity document, such as an identity card, a visa, a passport or a driving license, a lottery ticket, a transport ticket or even an entry ticket to cultural or sporting events.

There are primarily two types of RFID tag; tags comprising an integrated electronic circuit, called (electronic) chip-based tags, and tags not comprising an integrated electronic circuit, generally called chipless RFID tags in the art.

(Active or passive) chip-based RFID tags generally comprise an antenna, an electronic circuit, and a memory for storing an identification code. The electronic circuit makes it possible in particular to receive the signal transmitted via the read terminal and to transmit, in response, in a determined frequency band, a modulated signal containing the identification code stored in the memory. For passive chip-based RFID tags, part of the energy carried by the radio waves transmitted via the read terminal is used to supply electric power to the chip.

Due to the presence of electronic circuits in chip-based RFID tags, these tags have a non-negligible cost price. It is in particular in order to reduce this cost price that it has been proposed to produce chipless tags. This type of chipless RFID tag therefore requires neither an integrated circuit nor discrete electronic components, such as for example a transistor and/or a coil and/or a capacitor and/or an antenna; it is their conductive geometrical characteristic that brings about a specific behavior, in particular of resonator type. This characteristic of resonance at a given frequency makes it possible to print chipless RFID tags directly onto a substrate at lower costs than those of traditional RFID tags.

Chipless RFID tags are typically prepared using etching or stamping techniques in which a sheet is cut in order to create the final structure. For example, by etching a specific set of structures defining resonant frequencies into a conductive film, it is possible, by virtue of the set of resonant frequencies, to define a corresponding identification code. This method increases the cost of such tags by requiring each resonator to be manufactured individually, for example through laser etching, which is a process that is not only expensive but also difficult to industrialize.

The use of conductive metallic ink has also been described as a technology for directly printing chipless RFID tags onto a substrate, for example inkjet printing. Unfortunately, conductive inkjet printing has not yet proven satisfactory for printing personalized chipless RFID devices. On the one hand, conductive ink particles having small diameters, that are uniform and are made of high-conductivity material such as gold and silver are too expensive. On the other hand, if making do with inexpensive particles, these are generally characterized by a low conductivity and variable sizes that are incompatible with the overall interconnectivity necessary for the printed structures to produce personalized chipless RFID devices. In addition, some media are incompatible with direct conductive ink printing, thereby greatly limiting the applications thereof. As a result, inkjet print heads are not suitable for printing ink at the scale necessary to code individual resonant structures on any type of medium.

Patent application US2009128290 has also proposed a hybrid printing technology that combines analog printing methods with digital printing methods for printing conductive ink; in particular, US2009128290 claims a method for printing chipless RFID tags comprising: printing an RFID antenna model precursor using a first printing method (analog consisting of intaglio etching, flexography and screen printing), wherein the RFID antenna model precursor comprises a plurality of disconnected cable segments; and printing a conductive ink (comprising a material chosen from the group consisting of graphite, copper, gold, nickel, silver, aluminum, platinum and mixtures thereof) using a second inkjet printing method in order to interconnect at least two of said plurality of disconnected wire segments. This method makes it possible to manufacture unitary chipless tags (that is to say each with a unique conductive pattern) while relying heavily on a proven industrial method for printing the precursor, that is to say the main surface of the conductive pattern forming the tag; the final conductive pattern is therefore produced in two steps by way of two different techniques. It is noted that, in this method, a different conductive pattern is produced in each step.

Patent application CA2089060 (A1) describes the application of a colored or metallic foil on toner printed using a MIDAX print engine (ion deposition) on a substrate, such as paper, using a rotary printing cylinder and a rotary transfer cylinder having heated raised portions that are spaced circumferentially. The toner is applied to computer-controlled paper. As described in CA2089060 (A1), the field in question is that of decoration and, more particularly, of advertising; the colored or metallic foils that are used therein (in particular colored gold, silver, red and/or holographic) are thus not conductive.

Patent application EP2056656 (A2) relates to a method for manufacturing a conductive track structure on a flexible plastic film, the conductive track structure being connected to the plastic film by way of an adhesive layer cured by irradiation, and is formed of an electrically conductive thin layer in the form of a pattern, which is galvanically reinforced with at least one metallic layer, as well as an electronic component or an electronic circuit having such a conductive track structure; the conductive layer from the film (47, 94, 97) is applied there directly to the printed adhesive layer (57, 93, 96).

Although chipless RFID technology has a bright future, the fact remains that there is still a search for an alternative technique that is less expensive and more efficient than the conventional methods known to date for manufacturing personalized RFID tags of this type.

SUMMARY

The present invention thus provides a promising solution to this problem by proposing a method for manufacturing personalized chipless radiofrequency identification ("RFID") devices, in particular the manufacture of personalized chipless RFID tags.

In particular, the present invention relates to a method for manufacturing chipless radiofrequency identification devices, characterized in that it comprises a multilayer printing method comprising
- a step of digitally printing a pattern by printing a printing product,
- followed by a step of selectively depositing a conductive film, comprising an application film layer and a conductive film layer, on the preprinted pattern through contact between the printing product and the application film layer.

More particularly, the present invention relates to a method for manufacturing chipless radiofrequency identification devices, characterized in that it comprises a multilayer printing method comprising
- a step of digitally printing a pattern by printing a printing product, for example through varnish/ink inkjet printing or through toner electrophotography (xerography) printing,
- followed by a step of selectively depositing conductive "gilding" on the preprinted pattern through contact between the printing product and a multilayer film comprising a conductive film layer, preferably a conductive metal foil/film layer.

The present invention also relates to the chipless radiofrequency identification device as such, said device being characterized by a multilayer composition comprising
- a substrate,
- a pattern printed digitally on the substrate and consisting of a printing product such as an ink, a varnish and/or a toner,
- an identical pattern superimposed on the printed pattern and consisting of a conductive film comprising an application film layer in contact with the printing product and a conductive film layer.

DETAILED DESCRIPTION

Figure 1:
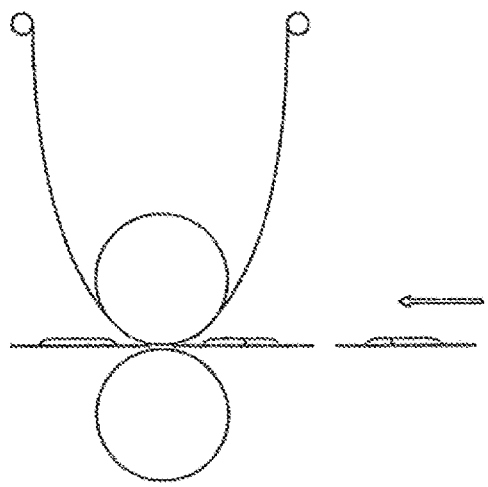
FIG. 1 is an example embodiment of one or more sets of pinch rollers.

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

As already explained in the introduction, this type of chipless radiofrequency identification device therefore requires neither an integrated circuit nor discrete electronic components, such as for example a transistor and/or a coil and/or a capacitor and/or an antenna. In addition, it is also obvious that this type of device will preferably be characterized by a passive behavior, since it will not have to incorporate a local energy source (such as a battery).

It is recalled that "device" should be understood to mean a package, a document, a tag, in particular a security document, and possibly any object and/or living being on which it is possible to produce the chipless RFID identification marker or to which a medium for the marker is able to be attached.

One particular feature of the manufacturing method according to the present invention and of the devices thus manufactured is that the conductive part of the device may be produced in a single step when selectively depositing conductive "gilding" on the preprinted pattern. This represents an additional advantage over the majority of existing techniques, which require an additional step, for example a step of soldering conductive components or combining two different technologies.

Techniques for gilding a substrate, for example a printed substrate, are well known to those skilled in the art. The basic principle of this technique is based on depositing an additional coating (that is to say, gilding or material) on the substrate, using a "gilding" deposition device, for example by applying/pressing a foil (bearing said coating or gilding) onto selected areas of the substrate so as to adhesively bond the desired part of the foil to the selected areas. This technique may for example comprise depositing adhesive on the substrate in a predetermined pattern before depositing the personalization coating (for example the gilding foil) on the adhesive deposited on the substrate. The adhesive may be deposited by way of one or more techniques, such as for example inkjet printing, toner-based printing, screen printing or offset printing.

It is obvious to those skilled in the art that the terms "gilding" and "gild" used in the present invention are not limited to the use of gold leaf and that any "gilding" device may be used. In the context of the present invention, these terms of course cover all types of conductive foils (sometimes also called metal foils) among which mention may be made by way of illustrative and non-limiting example of silver, copper, gold, aluminum, zinc, nickel, iron and/or any conductive alloy and/or salt. In general, a gilding foil pressed against the substrate to be personalized is used, and the present application therefore uses this term to denote the general use of a gilding device. However, in order to avoid any problem with interpretation, the Applicant has given preference to using the term "film" (comprising inter alia a conductive material film layer) in the present description and in the claims.

By combining these two printing techniques, that is to say digital printing and gilding, the Applicant has advantageously succeeded in responding to the challenges raised in the design of chipless radiofrequency identification devices, said devices generating an identification code able to be read by an electromagnetic wave transceiver reader; the operating principle of said reader is based on transmitting an electromagnetic signal in the direction of the identification device (for example the tag), which will reflect said signal according to its geometry (and for example its natural resonance characteristics) and upon the capturing of said reflected signal by the reader—processing the received signal (in particular through a decoding step) will thus make it possible to deduce the information contained in the device (for example the tag).

Thus, generally speaking, the chipless radiofrequency identification devices according to the present invention form part of an RFID system that also comprises one or more RFID readers that are themselves connected or not connected to supervisory computers or to a circuit board that performs a processing operation, which may for example create a link with existing databases. These readers therefore make it possible to identify objects by virtue of the RFID tags that are affixed thereto, the what are known as chipless RFID tags being comparable to a static radar target with a specific electromagnetic signature. Thus, in one particular embodiment of the present invention, the chipless RFID readers are therefore comparable to a radar in terms of operation, for example an aerial radar detecting the signature of aircraft to within a scale and power factor. By way of illustration, chipless RFID tags may be seen as radar targets having a particular time or frequency signature. Any type of radar suitable for receiving/identifying the signal back-transmitted by the RFID tag may advantageously be used in the context of the invention; by way of illustration and without limitation, mention will be made of pulse radar.

By virtue of the claimed method, it is possible to deposit conductive patterns having very good conductivity and a good resolution in terms of the dimensions of the patterns that are produced and, more particularly, precision of the edges of the patterns that are produced.

By way of illustration, this excellent conductivity is achieved by virtue of using a conductive metal material of very good quality in terms of purity and of volumetric arrangement of the atoms, thereby giving it a conductivity of a value very close to that of the corresponding perfect metal (referred to as "bulk metal"); as explained in more detail in the following description, this metal foil is more often than not produced using vacuum deposition, thereby making it possible to obtain the very good quality of the metal thus obtained. The conductivity of said metal is thus at least 10 times greater than that which could be obtained using another type of deposition technique, such as for example in the printing of conductive ink (this being the case regardless of the deposition printing method, for example flexography, screen printing, inkjet printing, etc.). Unexpectedly and advantageously, the Applicant has succeeded, by virtue of its method, in achieving performance in terms of radar cross section of the tags thus produced that is close to that known from using a "printed circuit" production approach, for example through lamination, on a dielectric substrate, of a bulk metal (such as copper, typically having a thickness of 17 μm), the latter having an atomic structure close to an ideal material, that is to say a pure material, whose atoms would be arranged perfectly with respect to one another. This "printed circuit" production technique is known to be very efficient; however, for reasons of price and manufacturing efficiency, it is incompatible with the production of chipless radiofrequency identification devices according to the present invention. Radar cross section is a very important variable for characterizing the intrinsic performance of chipless RFID tags. For a given transmitted power, it indicates the power level that will be backscattered by the target (here the tag) into space, and more particularly in the direction of the transmitted wave. It is linked to several parameters of the tag, such as firstly the shape of the conductive patterns, the conductivity of the conductive patterns, and their thickness. It is noted that the choice of the thickness of the metal in printed circuits is linked to a physical phenomenon known by the name of skin effect. This phenomenon refers to the notion of skin thickness (δ in meters, which depends on the frequency of the signal), which may be represented by the formula $$\delta = \sqrt{\frac{2}{\omega\mu\sigma}} = \sqrt{\frac{2\rho}{\omega\mu}} = \frac{1}{\sqrt{\sigma\mu\pi f}}$$

where δ is the skin thickness in meters [m],
  f is the frequency of the current in hertz [Hz],
  ω is the angular frequency in radians per second [rad/s] (ω=2.π.f)
  σ is the electrical conductivity in siemens per meter [S/m]
  ρ is the resistivity in ohm-meters [Ω.m] (ρ=1/σ), and
  μ is the magnetic permeability in henries per meter [H/m], this permeability having the value 4π10-7 for a vacuum which indicates the minimum thickness of metal that will allow the electric current to flow in an optimum manner; this phenomenon thus makes it possible to characterize the surface area "S" in the cross section of the conductor where the current is concentrated. Insofar as this surface area S is involved directly in the expression of the resistance R of a homogeneous conductive wire (R=ρ.l/S, where l is the length in meters of the wire and ρ is the resistivity in ohm-meters), the skin effect is of very particular interest when considering losses through the Joule effect and therefore the performance of the conductive materials and therefore of our chipless radiofrequency identification devices. Specifically, the wave that is sent to the devices (tags) creates a current that flows in the conductive patterns. Since these currents are at the origin of the backscattered wave, they are therefore involved directly in the power level of the RF signature that the reader will be able to record (as a first approximation and in the simple case of a linear current distribution in one direction (example of a short-circuited dipole), the greater the amplitude of the current in the conductive track, the greater the radar cross section, this being the case for a given transmitted power). In order to maximize the backscattered signal, it is important to ensure the good conductivity of the materials and the good flow of current in the conductive materials present on the devices (tags). Thus, for planar structures with a rectangular cross section, that is to say patterns corresponding to those produced in the context of the present invention, when the thickness of the conductive layer is less than twice the skin thickness at the frequency under consideration, the surface area S in which the current is able to flow is, as a first approximation, less than that which it could have in a more advantageous case corresponding to a greater thickness. This should naturally lead to the selection of thicknesses of conductive patterns, and therefore of conductive film layers of the gilding film, that are thicker than twice the skin thickness since one of the objectives that is sought is conductivity and good current flow within the devices. Specifically, any reduction in the cross-sectional surface area of the conductive pattern with respect to the optimum case given by the skin thickness ratio will increase the resistance of said conductive pattern and therefore lead to losses through Joule effects in accordance with the relationship $R=\rho.l/S$.

However, the Applicant has unexpectedly found that chipless radiofrequency identification devices manufactured according to the claimed method made it possible to meet the requirements in terms of conductivity and current flow necessary for the use/intended purpose thereof with conductive film layer thicknesses lower than those that would have been recommended in theory.

Thus, according to one particular embodiment of the present invention, the chipless radiofrequency identification devices are characterized in that they comprise printed patterns the conductive film layer thickness (originating from the gilding film) of which is less than 2.5 times its skin thickness (calculated in accordance with the above formula) at a given frequency, for example less than twice its skin thickness, or even less than 1.75 times its skin thickness.

Without wishing to be limited by this explanation, the Applicant believes that the method according to the present invention makes it possible to obtain optimum operation of chipless radiofrequency identification devices that demonstrate better electrical conductivity and current flow properties within conductive patterns and an unexpected ability to transmit and receive electromagnetic waves by virtue of a combination of factors, of which the following are cited by way of illustration:

the constitution/quality of the conductive film layers that are used;
the higher printing resolution of the digitally printed patterns, which makes it possible to obtain, after gilding, a quality of the printed/gilded patterns that makes it possible to maintain their conductive properties;
better printing precision of the digitally printed patterns, which makes it possible to obtain, after gilding, a quality of the printed/gilded patterns and, more particularly, a regularity of the edges of the printed/gilded patterns, that makes it possible to maintain their conductive properties.

The present invention thus makes it possible to manufacture chipless radiofrequency identification devices on a large scale while minimizing the amount of conductive metal that is used by virtue of the small conductive film layer thicknesses needed to produce them. However, and this constitutes one particular embodiment of the present invention, the chipless radiofrequency identification devices are also advantageously characterized in that they comprise printed patterns the conductive film layer thickness (originating from the gilding film) of which is greater than 100 nm, for example more than 150 nm, 200 nm, 250 nm, 300 nm, 400 nm, or even more than 500 nm. Although these thicknesses are greater than the usual thicknesses (for example 80 nm) that are used in conventional gilding techniques (for example techniques for finishing substrates), those skilled in the art have known techniques enabling them to manufacture the films comprising this gilding film layer, as described below in the description.

According to one particular embodiment of the present invention, the chipless radiofrequency identification devices are also advantageously characterized in that they comprise printed patterns the conductive film layer thickness (originating from the gilding film) of which is less than 2 microns, for example less than 1.5 microns, or even less than 1 micron or less than 0.75 microns.

Although there is theoretically no real limit as regards the choice of frequency band recommended for using the chipless radiofrequency identification devices according to the present invention, a low limit of said band will preferably be used, depending on the skin thickness values. Thus, taking into account the values of the thicknesses of the conductive film layers of the printed patterns and their conductivity according to the present invention, it is estimated that 400 MHz constitutes a minimum frequency. With regard to the upper limit, it is believed that this is linked to the resolution of the conductive depositions that will be obtained (which essentially depends on the thickness of the conductive film layer of the gilding film); it is thus estimated that 100 GHz constitutes a maximum frequency. Specifically, beyond this frequency, the patterns to be produced will probably be too small for the recommended technology. In one particular embodiment according to the present invention, a frequency band greater than 3 GHz and/or less than 10 GHz may advantageously be selected.

One advantageous specific feature of the claimed method and device lies in the possibility of controlling the thickness and the type of materials (in particular dielectric materials) that are used as digital printing product between the gilding film containing the conductive film layer and the substrate, for example a varnish, an ink and/or a toner. By way of illustration, considering the use of paper as a substrate to produce a chipless RFID tag, the medium for the conductive film will ultimately consist of the object on which the tag will be placed, of the paper, of the printing product (toner/varnish/ink) and of the application film layer of the gilding film as described below in the description. However, the thickness of the printing product plays an important role in the RF signature of the tag insofar as the presence of the dielectric layer makes it possible to space the conductive foil from the substrate (the paper in our example) and from the object; and since the substrate and the object generally exhibit more conductive losses at the usage frequencies of the tag than the printing product, the thickness of the printing product makes it possible, by moving the conductive film layer away from the rest of the medium, to move the field lines created by the incident wave away from lossy materials such as the substrate and the object. In this way, the losses of the backscattered signal are reduced, thus promoting the resonance of the conductive patterns and therefore the power, as well as the general frequency shape of the backscattered wave, in other words the radar cross section of the tag. Promoting the resonant character of the patterns will have a favorable impact on the amount of information able to be coded on the chipless radiofrequency identification device. It will thus be possible to produce a greater number of resonators (these, which are more resonant, will each occupy a smaller frequency band) for a given frequency band (for example 3 GHz-10 GHz). Since there is a direct link between the number of resonators and the coding capacity, the coding capacity will be increased at least in proportion to the number of resonators. Beyond the flexibility, speed, precision and reliability of digital printing, the present invention therefore also makes it possible to modify the RF signature of the chipless radiofrequency identification device as desired, not only by virtue of the shape of the conductive pattern but also by virtue of selecting the type of printing product and/or by virtue of the thickness of the printing product. This feature is extremely relevant since this control/adjustment is advantageously combined with exact knowledge of the thickness and of the conductivity of the conductive film layer, since these are constant for each selected roll of gilding.

By way of illustration, conventional paper has losses (expressed in tan δ–loss tangent) that are expressed as equal to 0.12. However, the varnish that is used has a tan δ of 0.04. It is seen, by comparing the values of paper with that of varnish, that if the field proposition in varnish is increased with respect to paper, the losses present in the tag are reduced.

Another advantageous specific feature of the claimed method and device lies in the fact that the digitally printed pattern consists of a printing product (varnish/ink/toner) that is compatible with a large number of media. Unlike the conductive inkjet approach (an approach that is not only expensive but also impossible with certain substrates into which there is a risk of the conductive ink penetrating, thereby causing an irregular and uncontrollable thickness of ink at the surface), it is now possible to deposit the printing product (varnish/ink/toner) on a large number of substrates, in particular paper, cardboard, PET, etc. Specifically, regardless of the substrate that is used, it is possible, by virtue of the present invention, to obtain a good resolution of the printed pattern and therefore of the conductive film layer. With the claimed method, the metal layer (conductive film layer) that is the most sensitive layer for the application (since there is a direct link between the geometry of this layer and the RF signature of the tag, that is to say its identifier) will always be able to be deposited on the same material, under controlled conditions, this being the case regardless of the medium on which the tag will be positioned.

The coding capacities obtained by way of the chipless radiofrequency identification devices according to the present invention meet the standards in force since the tags that are obtained make it possible to have at least 40 bits of information, which corresponds to the EAN13 barcode. By way of illustration, values of more than 40 bits for a credit card format [that is to say 40/(85.60×53.98 mm)=40/46 bits/cm$^2$] have been obtained; thus, in one particular embodiment according to the present invention, the claimed devices are characterized by a coding capacity value greater than 0.85 bits/cm$^2$, for example greater than 1 bit/cm$^2$, greater than 2 bits/cm$^2$, or even greater than 5 bits/cm$^2$.

One additional advantage of the claimed method and device is that they make it possible to produce multilayer tags. By way of illustration and without limitation, printing in accordance with the method claimed according to the present invention may advantageously be performed in series after a device according to the present invention has been manufactured. A corresponding multilayer printing method would therefore be characterized by the following successive steps:

a step of digitally printing a pattern by printing a printing product, followed by a step of selectively depositing conductive "gilding" on the preprinted pattern through contact between the printing product and a multilayer film comprising a conductive foil, preferably a conductive metal foil.

This method is in particular compatible with producing tags on large surfaces (example in reel-to-reel mode) since the claimed technology is not limited either by the medium or even by the dimensions of the conductive tracks.

In one particular embodiment according to the present invention, the gilding technique has been optimized so as to promote better attachment performance of the gilding foil to the substrate while at the same time improving the quality and more particularly the fineness of the gilding deposit on the substrate. Despite the development and the precision of gilding techniques, the Applicant has observed that it was very difficult to reconcile these two conditions with known gilding techniques. One of the aims of the present invention therefore also consists in providing a particular gilding technique that promotes better attachment performance of the gilding foil to the substrate while at the same time improving the quality and more particularly the fineness of the gilding deposit on the substrate.

Thus, in one particular embodiment, the present invention uses a method for depositing traces of conductive material on a substrate in a printing machine comprising a printing station followed by a film laying station, comprising the following steps:

a. Providing the substrate,
b. Digitally printing a printing product in a pattern on the substrate,
c. Providing a film comprising at least one application film layer comprising a material B, a conductive material film layer, and a transport layer,
d. Applying the film, in the film laying station, to the substrate under pressure and temperature conditions that lead to selective co-adhesion between the printing product for printing the pattern and the application film layer of the film,
e. Removing the film from the substrate,
  e.1. the substrate comprising the application film layer of the film co-adhered to the printing product for printing the pattern and thus forming the traces of conductive material in said pattern,
  e.2. the remainder of the conductive film layer and preferably of the application film layer being recovered with the removed film,
characterized in that
  the printing product comprises a thermoplastic material A and, optionally, a thermosetting material,
  material B of the application film layer is thermoplastic,
  materials A and B each have a glass transition temperature Tg, and
  the conditions in step d are such that the Tg of each of materials A and B are reached and chemical bonds are created between materials A and B.

The glass transition temperature Tg may be measured using any suitable method. By way of illustration, mention will be made of differential scanning calorimetry (DSC), which is a thermal analysis method that is widely recognized in the field for measuring various temperatures and transition states.

By way of illustration, the polymer sample will be subjected to an increasing temperature ramp of the order of 10° C./min, the heat flux of which is measured in watts. The glass transition temperature marks the change from the glassy state of the material to the rubbery state, which is an endothermic phenomenon. Therefore, in order to define the value of the Tg, it is enough to wait until observing a decrease in heat flux as a function of temperature and then to use a tangential method. The obtained value corresponds to the Tg of the polymer.

Without wishing to be restricted by this explanation, the Applicant believes that the combination of these method/material features makes it possible to even better meet the aims mentioned above in the description; by way of illustration, the particular choice of materials A (as a component of the printing product (for example an ink, a varnish and/or a toner)) and B (as a component of the application film layer) represents a particular feature of the invention since this choice induces a thermoplastic behavior of the application film layer and of the printing product when they are brought into contact.

In addition, the corresponding manufacturing method differs from the prior art by virtue of its flexibility of use and by virtue of a reduction in manufacturing times as well as corresponding costs, thereby making it particularly attractive for the manufacture of chipless radiofrequency identification devices.

When the printing product is an ink or a varnish, in the context of the present invention, inkjet printing techniques for relief printing of the printing pattern, for example using piezoelectric printing heads that are adapted on the basis of the printing product (for example the ink and/or printing varnish that is used) will be favored.

The films that are used in the context of the present invention preferably comprise at least one application film layer comprising a thermoplastic material B, a conductive material film layer and a transport layer. Those skilled in the art generally refer to this type of film by the expression "gilding foil". Thus, the gilding foils (films) used in the context of the present invention consist of a plurality of superimposed film layers comprising, by way of non-limiting example:

an application film layer comprising a material B,
at least one gilding/conductive material film layer,
an optional protective film layer,
an optional release film layer, and
at least one transport layer that makes it possible to transport the other layers.

Figure 2:
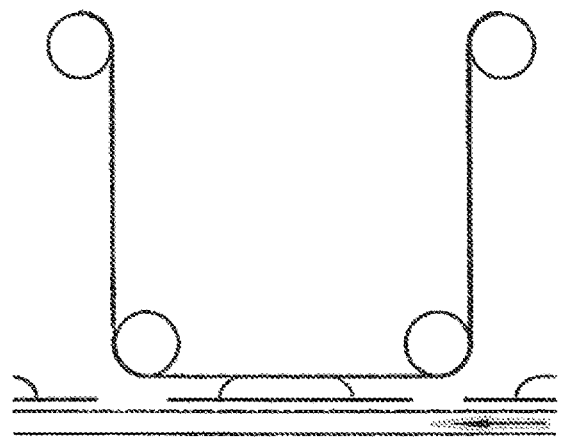
FIG. 2 is an example embodiment of one or more pressure rollers.
Figure 3:
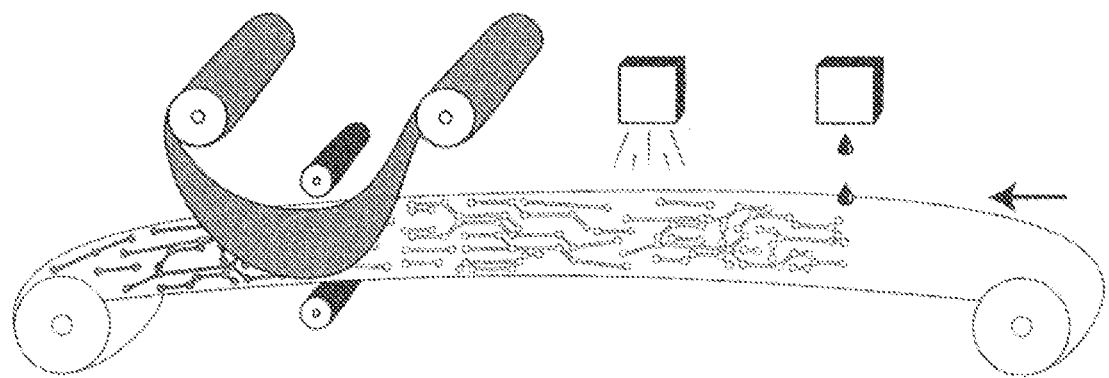
FIG. 3 illustrates an example embodiment of a method with a printing station followed by a film deposition station.

FIGS. 1 to 3 illustrate some embodiments of the present invention.

The step of applying the film to the substrate under pressure and temperature conditions that lead to selective co-adhesion between the printing product and the application film layer of the film (in particular between material A of the printing product and material B of the application film layer of the film) may be performed using any suitable method. By way of illustration, mention will be made of the use
of one or more sets of pinch rollers as described in FIG. 1;
of one or more pressure rollers as described in FIG. 2.

FIG. 3 illustrates one embodiment of the method according to the present invention with the printing station followed by the film deposition station.

FILM—COMPOSITION AND PROPERTIES

The films that are used in the context of the present invention preferably consist of a plurality of superimposed film layers comprising, by way of non-limiting and non-exhaustive example in the order of attachment to the substrate to be covered:

an application film layer comprising a material B,
followed by at least one conductive material film layer,
followed by an optional protective film layer,
followed by an optional release film layer, and
finally followed by at least one transport layer that therefore makes it possible to transport the other layers.

The films that are used in the context of the present invention are generally supplied in the form of a roll with a width substantially equivalent to the transverse dimension of the substrate.

Transport Layer

The transport layer makes it possible to transport the other layers forming the film and, in particular, the conductive material film layer and the application film layer according to the present invention. Its role is therefore primarily that of conveying the other layers forming the film until the final deposition of the application film layer and of the conductive material film layer according to the present invention.

The thickness of this layer is generally between 5 and 50 µm. A greater thickness tends to limit heat transfer, adversely affecting the transfer rate. A lower thickness entails numerous difficulties in terms of tension management. By way of illustration and without limitation, the transport layer may consist of polyester (PET) films. These may be co-extruded, have various structures, be surface-treated, etc.

Surface treatments may involve corona, plasma, silicone, acrylic, polyester, etc.

Depending on their nature, the PET films will allow a more or less efficient spreading as well as a different adhesion to the lower layers of the film.

Release Film Layer

The release film layer (which is optional but preferred), also known by the term "release layer", makes it possible to optimize the detachment of the transport layer from the rest of the film during application thereof. The basis weight of this film layer is generally not quantifiable since its thickness is preferably less than 0.1 µm.

When applying a certain temperature and pressure, exceeding its melting temperature will fluidize and vaporize part of the layer, thus creating a detachment. Depending on its nature, traces of the release film layer will be located either on the transport layer (for example the PET) or on the surface of the layer located underneath, or on both layers.

In the present invention, the remnants of the release film layer will preferably be located on the transport layer (for example the PET) so as not to contaminate the surface of the conductive material film layer. In one particular embodiment according to the present invention, the release film layer comprises and/or consists of an electrically conductive material, for example conductive polymers; specifically, in this particular embodiment, any contamination of the conductive material film layer by the release film layer will have no detrimental influence on the desired conductivity.

The release film layer may also advantageously comprise or consist of waxes soluble in solvents, emulsion waxes, natural waxes, silicone waxes, and/or synthetic waxes, etc.

By way of illustration and without limitation, the release film layer may be coated by way of conventional printing techniques such as intaglio etching or reverse intaglio etching, and/or flexography, etc.

Protective Film Layer

The protective film layer (which is optional) is also called lacquering and/or color film layer (since it may also comprise any type of colorant and/or pigment and/or matting or glossing agent). This protective film layer may be characterized by numerous properties depending on the desired use, be these chemical and/or physical resistance properties. This film layer is more often than not formed of a two-component varnish, acrylic resins, polyester resins, hydroxylated resins, and/or cellulose derivatives, etc. All these families of materials forming the protective film layer are generally organic polymers that are therefore considered to be insulators. Thus, according to one particular embodiment of the present invention, the film does not comprise a protective film layer in order to preserve the conductive characteristics of the conductive material film layer and thus to avoid insulation thereof. In one particular embodiment according to the present invention, the protective film layer comprises and/or consists of an electrically conductive material, for example conductive polymers; specifically, in this particular embodiment, the protective film layer will have no detrimental influence on the desired conductivity. The thickness of this layer is more often than not usually around values of between 2 μm and 3 μm.

The majority of commercial films have a protective layer based on non-conductive polymers, which makes them unsuitable for use thereof in any application in which conductivity is desired, since this results in an inability to channel electric current.

By way of illustration and without limitation, the protective film layer may be coated by way of conventional printing techniques such as intaglio etching or reverse intaglio etching, and/or flexography, etc.

Conductive Material Film Layer

In one particular embodiment according to the present invention, the main role sought for the conductive material film layer is therefore its conductivity. Said conductivity should specifically attain values suited to the market for chipless radiofrequency identification devices, in particular chipless RFID tags. By way of illustration, the conductive material film layer may be characterized by a surface resistance (sheet resistance) of less than 1 ohm per square (ohm/sq). This surface resistance may be measured using any suitable method; by way of illustration, mention will be made of the 4-point method, which makes it possible to perform this measurement using a generator that sends a current between points 1 and 4, and at the same time the voltage flowing between points 2 and 3 is measured. It is then enough to apply Ohm's law Voltage=Resistance/Current to obtain the resistance between points 2 and 3.

This film layer may therefore advantageously comprise and/or consist of any electrically conductive material. For example, this film layer may be formed of various metals deposited through a plurality of techniques such as sputtering, E-Beam and/or vacuum thermal evaporation, etc. The candidate metals for such an application are, by way of illustration, copper, silver, tin, chromium, gold, aluminum, and/or alloys, etc.

Thus, according to one preferred embodiment of the present invention, the conductive material of the conductive material film layer may advantageously comprise and/or consist of copper and/or silver, and/or tin and/or chromium and/or gold and/or aluminum, and/or conductive alloys.

The thickness of the conductive material film layer in the majority of commercial films is generally below 100 nm, for example close to 80 nm. In one particular embodiment according to the present invention, the conductive material film layer has a thickness of at least 100 nm, at least 150 nm, at least 200 nm, at least 250 nm, or even at least 500 nm in order to ensure the desired conductivity; in general, said thickness has an upper limit of 2 μm, for example less than 1.5 microns, or even less than 1 micron or less than 0.75 microns. Increasing the thickness of the conductive material film layer beyond certain values may effectively cause problems in terms of the fragility of the film, since the metal material is not as flexible as the organic matrix forming a polymer.

In one particular embodiment according to the present invention, the conductive material film layer comprises conductive polymers. By way of illustration and without limitation, the conductive material film layer comprising conductive polymers may be coated by way of conventional printing techniques such as intaglio etching or reverse intaglio etching, and/or flexography, etc.

In one particular embodiment according to the present invention, the conductive material film layer is characterized by a resistance of less than 100 Ω, for example less than 50 Ω, and preferably less than 5 Ω. This resistance may be measured using any suitable method; by way of illustration, mention will be made of the use of a multimeter in Ohm mode. This makes it possible to measure the resistance of a surface.

Application Film Layer

The application film layer, which is generally absent in the majority of film applications known to date in the field of the blind tooling of preprinted patterns, is essential in the present invention. Its thickness is generally between 2 and 10 μm.

One essential feature of the present invention lies in the fact that the application film layer comprises and/or consists of a thermoplastic material B, for example one or more thermoplastic polymers. In one particular embodiment according to the present invention, the application film layer comprises at least 50% by weight of thermoplastic material B, for example at least 70% by weight, preferably at least 80% by weight. This thermoplastic material B may consist of one or more thermoplastic chemical components, for example two or more thermoplastic resins/polymers.

According to one particular embodiment of the present invention, the application film layer therefore comprises a matrix of thermoplastic material B (for example of thermoplastic polymer B) and is characterized by a glass transition temperature Tg such that this film layer is
  dry to the touch at room temperature, and
  heat-reactivatable, that is to say that it has a thermoplastic behavior starting from which the application film layer (and a fortiori material B that it contains) will become ductile/malleable and thus develop a surface adhesion property when the treatment temperature (and in particular the application temperature in the film application step in the film laying station) is greater than this Tg.

Thus, in one particular embodiment of the present invention, thermoplastic material B is characterized by a Tg value of between 0° C. and 200° C., for example between 40° C. and 130° C., for example between 40° C. and 80° C. If thermoplastic material B consists of a homogeneous blend of two or more thermoplastic chemical components, the individual Tg value of each of these components will not be critical as long as the Tg of the blend meets the desired values; thus, thermoplastic material B will be able to accommodate thermoplastic components having Tg lower than 40° C., or even lower than 0° C. and/or greater than 80° C., or even greater than 130° C., as long as the Tg of said blend material is within the range of ideal values.

In one particular embodiment of the present invention, in addition to material B, the application film layer may also comprise other materials such as for example inert materials (for example inorganic fillers). Since these other materials generally have little influence on the Tg of the whole material forming the application film layer, the Tg of said application film layer is very close to that of material B.

Thus, in one particular embodiment of the present invention, the application film layer is characterized by a Tg value of between 0° C. and 200° C., for example between 40° C. and 130° C., for example between 40° C. and 80° C. The Tg of the application film layer will advantageously be measured by way of the DSC method indicated above in the description—the sample used for the measurement may advantageously originate from the material forming the application film layer before the corresponding film is manufactured.

According to one particular embodiment of the present invention, the thermoplastic polymer matrix (material B) of the application film layer has a particular affinity with material A of the printing product. This affinity may be expressed in various ways, mention of which will be made, by way of illustration:
- the fact that material B contains and/or consists of one (or more) resin(s) belonging to a chemical nature that is also present in material A of the printing product; by way of illustration and without limitation, this chemical nature will be selected from among a nucleophilic group (comprising oxygen and/or nitrogen), a hydroxyl group and/or a nitrogen-containing group; and/or
- that at least one of the resins is present both in material B of the application film and in material A of the printing product and is an acrylic resin, for example a similar and/or identical acrylic resin; and/or
- that at least one of the resins is present both in material B of the application film and in material A of the printing product and is a ketone resin, for example a similar and/or identical ketone resin; and/or
- that at least one of the resins is present both in material B of the application film and in material A of the printing product and is an aldehyde resin, for example a similar and/or identical aldehyde resin; and/or
- that at least one of the ingredients is present both in material B of the application film and in material A of the printing product and is of cellulose type: for example an ingredient consisting of cellulose acetate propionate, and/or cellulose acetate butyrate, and/or cellulose acetate, and/or nitrocellulose.

According to one particular embodiment of the present invention, the thermoplastic polymer matrix (material B) of the application film layer may be a polymer in the solvent phase or in the aqueous phase.

Without wishing to be restricted by this explanation, the Applicant believes that this common part between at least one of the components of material A and one of the components of material B will make it possible to create a chemical affinity between these two materials when they are brought into contact by virtue of their intrinsic characteristics and by virtue of the contact conditions. This affinity is responsible for the selective deposition since the application film layer comprising material B will be deposited only on material A and not on the rest of the substrate. A film that does not integrate this common part could either contaminate, or be deposited non-selectively entirely over the entire substrate, or not be deposited precisely and selectively on the pattern of the printing product since the transfer will not be operational.

By way of illustration and without limitation, the application film layer may be coated by way of conventional printing techniques such as intaglio etching or reverse intaglio etching, and/or flexography, etc.

Printing Product, Material A—Composition and Properties

Thus, in one particular embodiment of the present invention, the printing product comprises a thermoplastic material A, for example a thermoplastic polymer A, and optionally a thermosetting material. This printing product preprinted on the substrate guarantees the design of the future gilding and therefore of the chipless RFID tag. Depending on its composition, the film will or will not transfer to the substrate. It is essential for the transfer between the film and the preprinted pattern to be selective, that is to say favorable to the transfer only at the pattern (and therefore at the preprinted printing product) and not directly to the substrate.

By way of illustration and without limitation, this printing product may be formed of toner and/or ink and/or a varnish; it is preferably dielectric as explained above in the description for the targeted chipless RFID tag application.

By way of illustration and without limitation, in the case of a varnish, this may be solvent-based, aqueous or UV in nature. When it is UV in nature, it may be crosslinked using LEDs and/or UV radiation.

According to one particular and preferred embodiment of the present invention, the printing product is a UV ink and/or a UV varnish comprising a material designed for thermosetting as well as thermoplastic material A. It is the presence of this material designed for thermosetting that characterizes the fact that the corresponding ink/varnish exhibits a thermosetting behavior. According to one particular and preferred embodiment of the present invention, the preprinted printing product (and therefore the preprinted pattern) is crosslinked before being brought into contact with the film. This may result in the polymer network of the printing product being at its optimum in terms of three-dimensional density by virtue of the reaction of all of the photoinitiator sites. This may also result in a thermosetting behavior, that is to say that the thermosetting part of the varnish no longer has a glass transition temperature Tg but only a destruction temperature; thus, this thermosetting polymer present in the varnish will never become soft and will not develop a sticky surface since it will be completely dry to the touch.

Thus, according to some preferred embodiments of the present invention, the claimed method comprises, after the step of printing the printing product and before the step of applying the film, an activation step (for example using UV rays) that makes it possible to crosslink the printing product (the ink and/or the varnish).

Adding a thermoplastic material A to the printing product makes it possible to achieve the aims of selective attachment between the substrate and the film. By way of illustration for an ink and/or a varnish, selecting a material A, said material A belonging to a chemical nature analogous to material B present in the application film layer of the film and/or said material A having physical properties (for example Tg) adapted to those of material B present in the application film layer of the film, will modify the behavior of the printing product; the latter will become partly thermoplastic since thermoplastic material A will interfere with the polymer network initially designed for thermosetting. Thus, when the film is applied to the preprinted and preferably precrosslinked printing product, a total and selective transfer will take place by virtue of the affinity of materials A and B and by virtue of the conditions in which they are brought into contact. These observations also apply when selecting toner instead of inks/varnishes; however, in the particular case of toner, the Applicant has noted that the presence of thermosetting material, even if this was desirable, was not essential in order to achieve adhesion between the application film layer and the toner.

Conductive layers may therefore be deposited selectively by virtue, inter alia, of this affinity between material A and material B. Thus, any device comprising these layers of printing products and conductive films according to the present invention will also be characterized by the existence of an interstitial layer comprising material of the printing product and material of the application film layer of the film.

Thus, according to one embodiment of the present invention, thermoplastic material A of the printing product is
- heat-reactivatable (that is to say that it has a thermoplastic behavior), and
- becomes ductile/malleable and develops a surface adhesion property in the film application step in the film laying station (which film is itself heat-reactivatable).

This therefore makes it possible to develop a surface adhesion property between the printing product and the application film layer by virtue of materials A and B when the treatment temperature (and in particular the application temperature of the film in the film application step in the film laying station) is greater than the Tg of thermoplastic materials A and B and/or greater than the Tg of the printed/(crosslinked) printing products and of the application film layer of the gilding film.

In one particular embodiment according to the present invention, the printing product, preferably an ink/varnish, comprises at least 5% by weight of thermoplastic material A, for example at least 10% by weight, preferably at least 15% by weight. Even though high concentrations of thermoplastic material A may be contemplated, the printing product, preferably an ink/varnish, will preferably comprise less than 40% by weight, for example less than 30% by weight, preferably less than 25% by weight of thermoplastic material A.

Thus, in one particular embodiment according to the present invention, the printing product, preferably an ink/varnish, comprises at least 60% by weight, for example at least 70% by weight, preferably at least 75% by weight of material designed for thermosetting.

Thus, in one embodiment of the present invention that is particularly applicable to inks/varnishes, thermoplastic material A is characterized by a Tg value lower than 60° C., for example lower than 50° C., preferably lower than 40° C. According to one particular embodiment of the present invention, and as described in more detail hereinafter in the description, materials A of the ink/varnish printing product and B of the application film layer will be selected such that the Tg of material A is lower than the Tg of material B.

Since the ink/varnish printing product comprises only limited amounts of thermoplastic material A, it is obvious that the Tg of the printing product, after deposition (and crosslinking), will have a value that will be different from the Tg of thermoplastic material A contained in said product. When the printing product is a toner, its content of thermoplastic material is generally greater than 30% by weight, greater than 40% by weight, or even greater than 50% by weight.

In one particular embodiment of the present invention, the printing product is an ink or a varnish. After deposition/crosslinking, this printed printing product intended to be covered with a gilding foil is in the form of a film layer that is advantageously characterized by a Tg value of between −20° C. and 200° C., for example between 0° C. and 200° C., for example between 10 and 50° C., for example between 15° C. and 40° C.

In one particular embodiment of the present invention, the printing product is a toner. After deposition, for example through xerography, this printed printing product intended to be covered with a gilding foil is in the form of a film layer that is advantageously characterized by a Tg value of between 0° C. and 200° C., for example between 40° C. and 120° C., for example between 40° C. and 70° C.

The Tg of the film layer of the printed/(crosslinked) printing product (varnish/ink/toner) will advantageously be measured by way of the DSC method indicated above in the description—the sample used for the measurement may advantageously originate from the material forming the printing product after printing and crosslinking. According to one particular embodiment of the present invention, and as described in more detail hereinafter in the description, the printing product and the application film layer will preferably be characterized in that the Tg of the ink/varnish printing product is lower than the Tg of the application film layer.

Printing of the Pattern—Conditions

The present invention is therefore characterized in that the claimed method makes it possible to obtain a substrate comprising the application film layer of the film selectively co-adhered to the printing product for printing the pattern and thus forming, by virtue of the conductive material film layer, the traces of conductive material in said pattern. Said pattern (of the printing product) may be printed using any suitable method. By way of illustration and without limitation, mention will be made of screen printing, inkjet printing, xerography, etc. According to one particular and preferred embodiment of the present invention, the printing product is printed digitally, for example through inkjet printing or xerography printing, preferably through inkjet printing. This inkjet printing makes it possible to relief-print areas intended or not intended to be covered, depending on the composition of the printing product and more particularly on the presence or absence of material A, by the conductive material film layer (for example the gilding film). The gilding will therefore be deposited selectively. Varnish/ink inkjet printing is well known to those skilled in the art. Toner xerography printing is also well known to those skilled in the art.

The areas (and therefore the pattern) may advantageously be any type of geometric shape suitable for the generation of chipless RFID tags; they may in theory consist of various materials, for example inks and/or varnish and/or toner, even though it is preferable to use just one type of dielectric printing product when manufacturing the chipless RFID device.

The thickness of the printed printing product may advantageously be highly variable; by way of illustration and without limitation, mention may be made of a thickness of the deposited printing product film layer (ink/varnish/toner) (and measured just before being brought into contact with the film) of greater than 3 microns, for example more than 10 microns; and/or a thickness of the deposited printing product film layer (ink/varnish/toner) (and measured just before being brought into contact with the film) of less than 200 microns, for example less than 100 microns. With each manufacture of a batch of chipless RFID devices according to the present invention, preference will be given to selecting a single thickness value of the printed printing product so as to be able to increase the printing and gilding rates; by way of illustration, a maximum deviation of 10% around a selected thickness will thus be tolerated.

In fact, the relief of the patterns and therefore of the areas intended to be covered by a gilding foil preferably has a thickness of the order of a micron, preferably greater than five microns, or even greater than ten microns. This thickness—deposited beforehand in any way on the substrate; for example of the varnish and/or of the ink and/or of the toner—is generally less than a millimeter for relief printing. However, the present invention could also apply to substrates that have been printed using 3D technology, for example by way of inkjet (and/or varnish) printing in successive layers and thus having thicknesses that may range up to a few centimeters, for example less than 2 cm.

The substrate may be selected from among a large number of materials and may not be considered to be limited to materials commonly used in standard printing and/or personalization devices such as paper, cardboard and plastic substrates. Mention will be made by way of non-limiting example of metal, paper, nonwoven fabric, plastic, for example a methacrylic copolymer resin, polyester, polycarbonate, polyethylene, polypropylene, and/or polyvinyl chloride, or even cellulose materials such as for example wood, plywood or crystalline materials such as glass or ceramic, for example complex materials comprising one or more of these components such as for example milk cartons.

According to the present invention, the substrate (sheet, card, etc.) is generally in a rectangular or square shape. This sheet moves, generally by virtue of a substrate transport system in a printing machine, along a transport path oriented along a longitudinal axis from at least one input magazine supplying the printable and/or personalizable substrates, to at least one output magazine receiving the printed and/or personalized substrates, and therefore covered with traces of conductive material according to the present invention. The "lateral edges" of the substrate are the two edges located on either side of this longitudinal axis; the front and/or rear edges are its transverse edges. The substrate may also be in the form of a reel in a reel-to-reel machine.

Application of the Film

The step of applying the film to the substrate under pressure and temperature conditions that lead to selective co-adhesion between the printing product and the application film layer of the film (in particular between material A of the printing product and material B of the application film layer of the film) may be performed using any suitable method. By way of illustration, mention will be made of the use
of one or more plates that press the film onto the substrate;
of one or more sets of pinch rollers as described in FIG. 1;
of one or more pressure rollers as described in FIG. 2.

This step is therefore important since it conditions the positioning of the traces of conductive material on the substrate.

The pressure and temperature conditions will therefore advantageously be selected depending on materials A and B used respectively in the printing product and in the application film layer.

By way of illustration, the application temperature of the film is advantageously between 0° C. and 200° C., for example between 70° C. and 190° C., for example between 130° C. and 170° C. In one particular embodiment of the present invention, the application temperature of the film will also be selected as a function of the contact time for which the printing product and the application film layer are brought into contact and heated. Since it will be attempted to promote relatively brief contact times (for example less than a second), it has been observed that the application temperature of the film should advantageously be greater by at least 25° C. than the highest Tg of the application film layer and of the varnish/ink/toner film layer, for example at least 40° C. greater than this Tg, or even at least 60° C. greater than this Tg.

The present invention is also described illustratively and according to one of its particular embodiments in FIG. 3. It is possible to see therein, in the left-hand part of the figure, a gilding group according to the present invention that is located downstream of the printing station shown in the right-hand part of the figure. The substrate therefore moves from right to left. By way of illustration, the substrate may advantageously be formed of paper, flat cardboard, corrugated and/or microcorrugated cardboard and/or plastic. It may be in reel-to-reel or foil-to-foil form. When the substrate travels underneath the printing station, which may be a cylinder, a screen-printing screen, and/or inkjet heads, etc., the desired pattern is printed using a varnish/an ink or toner containing material A. In the case of inkjet heads, the varnish should be adapted to this type of application by having a very low viscosity. The printed thickness may advantageously vary from 5 µm to 100 µm in the majority of cases; however, as explained above in the description, this thickness will preferably be kept around a selected value when manufacturing a batch of chipless RFID tags.

Thereafter, the printed pattern (ink/varnish) is advantageously crosslinked to the maximum possible amount of its three-dimensional density as permitted by its structure and its reaction sites; this may be achieved using a drying means (as shown in the center of the figure) such as physical, IR, UV radiation, LED drying, etc. The printed pattern generally does not adhere to the surface after this drying/crosslinking step.

The gilding group in this illustration generally consists of at least two rollers (that are preferably motorized), installed facing one another, rotating for example in opposing directions, and the distance between which is able to be adjusted so as to adapt to various substrate thicknesses; according to one preferred embodiment of the present invention, this adjustment will take into account not only the thickness of the substrate but also the thickness of the printing product (for example the ink and/or the varnish) printed beforehand on the substrate and optionally taking into account thicknesses of the film and therefore of the film layers of the gilding foil that are deposited by the gilding group. According to one particular embodiment of the present invention, the spacing between the rollers facing one another may be motorized and controlled dynamically. According to one particular and preferred embodiment of the present invention, the surface of the upper roller is different from that of the lower roller; in particular, the surface of the upper roller is more compressible than that of the lower roller. By way of illustration, the upper roller has a compressible material on the surface that allows it to match the shape of the printed pattern of the printing product, whereas the lower roller will consist of a harder, for example non-compressible material. According to one particular embodiment of the present invention, the upper roller has a heating (and/or cooling) device that makes it possible not only to achieve the glass transition temperatures Tg of each of materials A and B, but also the glass transition temperatures Tg of the printed/(crosslinked) printing product and of the application film layer of the gilding film.

According to one particular embodiment of the present invention, the gilding group (or film application group) operates at a linear speed (at the surface of the rollers) greater than or equal to the speed of the substrate underneath the printing station so as not to slow the machine down.

The control features of the gilding group are given below by way of illustration: adjustable pressure (for example from 1 to 10 bar, preferably with an operating pressure greater than 1 bar), and/or adjustable speed; and/or adjustable temperature (for example an operating temperature of at most 250° C., for example between 0° C. and 200° C., for example between 70° C. and 190° C., for example between 130° C. and 170° C.); and/or coating hardness of the upper roller between 50 and 95 Shore A.

The travel of the printed (and crosslinked) pattern underneath the rollers will make it possible to heat the preprinted pattern containing material A beyond the Tg of material A and of the printed/(crosslinked) printing product comprising said material A. The thermoplastic nature of material A will allow same to be softened. The same applies for material B of the application film layer. The two materials thus softened may be considered to be "open", thus allowing the adhesion of an analogous material. The free groups (for example hydroxyl groups) of each material as well as the unsaturations will develop covalent chemical bonds between the materials. The attachment of material B to material A will thus be promoted, while at the same time avoiding any attachment of the application film layer to the non-preprinted substrate parts. The deposition will thus be said to be "selective".

In one particular embodiment according to the present invention, the release of the foil (of the film) from the substrate ideally takes place when the film is still hot so as to be within the best possible transfer conditions. The presence of an open angle when the film is peeled makes it possible to achieve good fineness while avoiding poorly defined contours.

One particular film composition that may advantageously be used in the context of the present invention is described below by way of illustration and without limitation.

A transport layer consisting of PET with a thickness of preferably between 15 μm and 24 μm (for example 19 μm), which represents the best compromise between mechanical properties and its ability to conduct heat when the film is applied.

A release film layer advantageously consisting of wax, for example a natural carnauba wax, with a melting point of preferably between 60° C. and 110° C. (for example around 85° C.). Thus, in line with the conditions mentioned above, when the application temperature of the film reaches 120-140° C. during the deposition, the wax will be vaporized. Since this is the very thin bond (nanometric scale) between the layers of the film, its state transformation will lead to the transport layer detaching from the rest of the film.

The optional protective film layer may advantageously be formed of derived PMMA hydroxylated acrylic polymers. The technology is based more often than not on the two-component reaction of hydroxylated polymers with resins containing isocyanate groups. This reaction will make it possible to densify the polymer network in order to improve the mechanical and chemical resistance properties. In order for this layer to be conductive, PEDOT:PSS polymers are advantageously introduced into the matrix (see the example below).

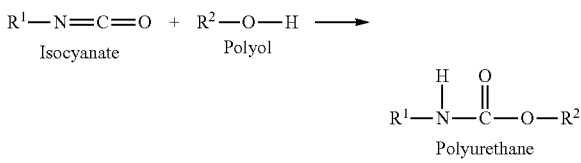

Where R1 and R2 are shorter or longer hydrocarbon chains.

A composition of 50% acrylic PMMA, 20% isocyanate and 30% PEDOT:PSS is a good balance in order to obtain the desired resistance and conductivity properties.

The conductive material film layer may advantageously consist of silver, copper and/or aluminum. The conductive material may be formed of a deposit of a thickness of between 100 nm and 1 μm, for example between 150 nm and 750 nm, for example between 200 nm and 500 nm, deposited using a PVD technique. This vacuum evaporation method is a thin-film deposition technique, and the vaporized material will deposit homogeneously on the film/substrate. The resistance value obtained for this conductive material film layer may advantageously be between 0.1 Ω and 100 Ω. The thickness of the conductive material film layer will be selected depending on the desired applications; the Applicant has managed to develop its method with conductive material film layer thicknesses ranging from 50 nm to the order of a micron. Thicknesses of more than 100 nm, for example more than 150 nm, 200 nm, 300 nm, 400 nm, 500 nm have advantageously been achieved and tested in the context of the present invention. Thus, as explained below in the application of chipless radiofrequency (RFID) identification tags, obtaining conductive material film layer thicknesses greater than 150 nm, greater than 250 nm, even greater than 400 nm or even greater than 500 nm has opened up the way to these new applications.

The application film layer (comprising and/or consisting of material B) may advantageously be formed of hydroxylated acrylic and polyester resins, and of nitrocellulose and fillers. The advantage of the acrylic and polyester resins being hydroxylated and/or carboxylated is that of creating attachment sites that promote the chemical bonds with a material A (originating from the printing product) contact interface. One effective formula may be formed of 40% hydroxylated acrylic resin, 30% hydroxylated polyester resin, 20% nitrocellulose and 10% silica-type fillers (% age by weight). The final formula will preferably be a dry-extract solvent phase between 15 and 30% by weight applied by rotogravure. It is expedient to obtain a Tg of material B within a range of between 40 and 80° C.

The printing product may advantageously be a UV inkjet varnish. Its main characteristic is a low viscosity of between 5 mPa.s and 70 mPa.s, for example between 10 mPa.s and 50 mPa.s. It may be formed of a plurality of monomers such as dipropylene glycol diacrylate (DPGDA), trimethylolpropane triacrylate (TMPTA), the monomer part preferably representing at least 50% by weight of the composition of the printing product, for example 60% by weight. The photoinitiator part that makes it possible to initiate the crosslinking is preferably between 10 and 25% by weight of the composition of the printing product, for example of the order of 20% by weight; it is advantageously formed of alpha-hydroxycyclohexyl phenylketone and of alpha-hydroxy ketone. Material A is preferably between 15 and 30% by weight of the composition of the printing product, for example 20% by weight; it may be a hydroxylated acrylic resin whose Tg is relatively low, for example lower than 50° C., for example lower than 40° C. or even lower than 20° C.

The aim is therefore to reactivate both the printed/(crosslinked) printing product as well as the application film layer when they are brought into contact while exceeding their respective temperature Tg; this makes it possible to generate attachments between the two materials and allow the desired adhesion, for example by virtue of the hydroxyl groups of the resin of material A and of material B.

In one particular embodiment relating more particularly to varnishes/inks, the printed/crosslinked printing product is first reactivated as soon as the temperature increase reaches the Tg of said printed/crosslinked printing product; then, the temperature reaches the Tg of the application film layer, thereby allowing adhesion between the printing product and material B of the application film layer.

Material A and Material B Interactions

An abovementioned temperature range makes it possible to slightly soften materials A and B, and in particular the printing products and the application film layer, by virtue of exceeding their respective glass transition temperature Tg. These conditions will be selected so as to allow the creation of chemical bonds between materials A and B and therefore improved and selective attachment between the substrate and the film; these conditions will also be controlled so as to avoid any excursion/temperature rise, thereby making it possible to avoid
- material B present in the application film layer (and also the film layer itself) from becoming excessively tacky/molten; thereby making it possible to avoid any adhesion of the application film layer directly to the substrate in the non-preprinted printing product areas comprising material A,
- material A (and also the printed/crosslinked printing product itself) from becoming excessively tacky/molten; thereby making it possible to prevent the printing pattern from losing its fineness and generating traces of conductive material that are too coarse and therefore unusable.

According to one particular embodiment of the present invention, which embodiment is particularly relevant for varnishes/inks, materials A of the printing product and B of the application film layer will be selected so that the Tg of material A (Tg[A]) is lower than the Tg of material B (Tg[B]); preferably, Tg[A] will be lower than 0.9 Tg[B], or even lower than 0.8 Tg[B], for example lower than 0.7 Tg[B], for example lower than 0.5 Tg[B].

According to one particular embodiment of the present invention, which embodiment is particularly relevant for varnishes/inks, materials A of the printing product and B of the application film layer will be selected so that the Tg of the (printed/crosslinked) printing product containing material A is lower than the Tg of the application film layer containing material B; preferably, Tg ((printed/crosslinked) printing product) will be lower than 0.95 Tg (application film layer), or even lower than 0.9 Tg (application film layer), for example lower than 0.85 Tg (application film layer).

According to one particular embodiment of the present invention, which embodiment is particularly relevant for toners, materials A of the printing product and B of the application film layer will be selected so that the temperature difference between the Tg of the (printed) printing product containing material A and the Tg of the application film layer containing material B is lower than 30° C., specifically for example in a range of temperature values between 35° C. and 75° C.

According to one particular embodiment of the present invention, materials A of the printing product and B of the application film layer will be selected so that they comprise an identical chemical nature; by way of illustration and without limitation, this chemical nature will be selected from among a nucleophilic group (comprising oxygen and/or nitrogen), a hydroxyl group and/or a nitrogen-containing group. This will promote the creation of covalent chemical bonds greater than 200 kJ/mol between the atoms in order to promote adhesion between the surfaces of the printed/crosslinked printing product and of the application film layer.

According to one particular embodiment of the present invention, the Applicant has unexpectedly discovered that it was possible to optimize the deposition performance of its method by controlling the temperature of the printing product after printing and before application of the film. Thus, in one preferred embodiment according to the present invention, one or more of the conditions cited below is applied to the claimed method:
- the temperature of the printed printing product between the step of printing said product and the step of applying the film is kept at a value greater than 35° C., for example greater than 40° C., preferably greater than 45° C.; and/or
- the temperature of the printed and crosslinked printing product between the step of crosslinking said printed product and the step of applying the film is kept at a value greater than 35° C., for example greater than 40° C., preferably greater than 45° C.

However, even though this does not represent a preferred embodiment, it is obvious that the method according to the present invention also covers the case where the step of applying the film takes place separately (in terms of time or space) in relation to the step of printing the printing product.

According to one particular embodiment of the present invention, the claimed method also comprises a method for depositing traces of conductive material, which also comprises a method for printing insulating traces in a single pass in the printing machine. The claimed method thus comprises not only printing a pattern of a first printing product comprising material A in accordance with the abovementioned aims of attaching the application film layer and therefore the conductive material, but also printing a second printing product different from the first printing product that is used; this second printing product will be selected so as to give it an insulating property in terms of electrical conduction. Beyond its insulating property, the second printing product will be selected so as to prevent any attachment to the application film layer of the film; thus, by way of illustration, the second printing product preferably does not comprise material A, or any other material similar to material A in terms of chemical nature and/or physicochemical properties so as to avoid affinity with material B of the application film layer. By way of illustration and without limitation, the second printing product will be selected from among thermosetting varnishes (or varnishes designed for thermosetting), preferably UV-thermosetting varnishes—they will moreover preferably be free of any thermoplastic polymer with a Tg equal to or lower than the application temperature of the film to the substrate. This type of method, by virtue of using a foilable (conductive and/or insulating) and non-foilable (conductive and/or insulating) varnish, opens up an interesting field of application for printed electronics with the possibility of printing insulating and/or conductive traces in one pass in the printing machine according to customer needs.

Series Conductive Inkjet

According to one particular embodiment of the present invention, the claimed method comprises not only a pattern printing step, followed by the step of depositing traces of conductive material in said pattern, but it also comprises an additional subsequent step of inkjet printing conductive printing product at least partly on the traces or exclusively on said traces of deposited conductive material. Thus, by way of illustration, the present invention also makes it possible to add a conductive inkjet varnish to the surface of the conductive trace after applying the conductive material film layer. The advantage of this conductive varnish is manifold since it will make it possible to keep a high conductivity while at the same time providing the mechanical and chemical resistance properties of a surface varnish. It integrates fully into the problems observable in the field of printed electronics.

This additional printing product may advantageously be selected from among varnishes formed of conductive polymers such as polypyrrole, polyaniline, PEDOT: PSS, polyacetylene and their derivatives, etc. It is also possible to add metal or carbon-based fillers in order to improve this conductivity. By way of illustration, mention will also be made of conductive inks based on conductive nanoparticles such as silver, copper and/or gold nanoparticles.

These conductive compounds may be of various solvent-based, aqueous or UV natures; they may also be dried through UV or LED radiation or through thermal or IR drying.

Chipless RFID Tag

The printing/gilding method described and detailed above has been found to be particularly attractive and efficient for the manufacture of chipless radiofrequency identification (RFID) tags (also called chipless RFID tags) of the present invention. These radiofrequency identification tags are therefore characterized by the generation of an identification code able to be read by an electromagnetic wave transceiver. By way of illustration, mention will be made of the manufacture of a chipless RFID tag comprising a particular geometry of conductive paths produced by way of the method described and claimed according to the present invention (with the conductive material film layer); this particular geometry of electrically conductive paths will, by way of illustration, consist of a plurality of separate parallel conductive strips formed on a dielectric support (varnish/ink/toner), in which conductive bridges interconnect neighboring conductive strips, the conductive bridges defining, between the conductive strips, portions of dielectric strips of different lengths, each portion of dielectric strip determining a resonant frequency of the tag, the set of resonant frequencies of the tag defining an identification code able to be read by an electromagnetic wave transceiver. In one preferred exemplary embodiment, the geometry of the conductive paths will therefore advantageously be produced on any substrate by way of a contactless printing technology (for example digital ink/varnish inkjet printing, for example by way of piezoelectric printing heads, or digital toner xerography printing) for printing the (for example insulating) printing product followed by the electrically conductive material gilding technology. The abovementioned bridges and strips will therefore advantageously be produced from the same gilding foil. As a reminder, in one particular embodiment according to the present invention, the manufacture of chipless RFID tags according to the claimed method will be characterized by a thickness of the conductive material film layer (for example copper and/or silver) greater than 100 nm, for example more than 150 nm, 200 nm, 250 nm, 300 nm, 400 nm, or even more than 500 nm; and/or
  by a thickness of the conductive material film layer (for example copper and/or silver) less than 2 microns, for example less than 1.5 microns, or even less than 1 micron; and/or
  by a thickness of the deposited printing product film layer (ink/varnish/toner) (measured just before being brought into contact with the film) greater than 3 microns, for example more than 10 microns; and/or
  by a thickness of the deposited printing product film layer (ink/varnish/toner) (measured just before being brought into contact with the film) less than 200 microns, for example less than 100 microns.

It is understood from the above text that the present invention also relates to at least one printing device (or a system) comprising means for implementing at least one of the methods described in the present application. By virtue of the conductive considerations provided in the present application, it is understood that such systems or devices have means for performing the functions described with reference to the method and that it is not necessary to describe these means.

The present application describes various technical features and advantages with reference to the figures and/or to various embodiments. Those skilled in the art will understand that the technical features of a given embodiment may in fact be combined with features of another embodiment unless the opposite is explicitly mentioned or it is obvious that these features are incompatible or that the combination does not provide a solution to at least one of the technical problems mentioned in the present application. In addition, the technical features described in a given embodiment may be isolated from the other features of this embodiment unless the opposite is explicitly mentioned.

It should be obvious to those skilled in the art that the present invention allows embodiments in many other specific forms without departing from the field of application of the invention as claimed. Therefore, the present embodiments should be considered by way of illustration, but may be modified within the field defined by the scope of the appended claims, and the invention should not be limited to the details given above.

What is claimed is:

1. A chipless radiofrequency identification device, said device being characterized by a multilayer composition comprising
  a substrate,
  a pattern printed digitally on the substrate and consisting of a printing product comprising an ink, a varnish and/or a toner,
  an identical pattern superimposed on the printed pattern and consisting of a conductive film comprising an application film layer in contact with the printing product and a conductive film layer, the conductive film configured to reflect a radiofrequency signature indicative of information coded on the chipless radiofrequency identification device only by resonant backscattering of the conductive film.

2. The chipless radiofrequency identification device as claimed in claim 1, characterized in that the printed pattern is a dielectric.

3. The chipless radiofrequency identification device as claimed in claim 1, characterized in that the thickness of the printed pattern is greater than 3 microns and less than 200 microns.

4. The chipless radiofrequency identification device as claimed in claim 3, characterized in that the thickness of the printed pattern is greater than 10 microns and less than 100 microns.

5. The chipless radiofrequency identification device as claimed in claim 1, characterized in that the thickness "e" of the printed pattern is between 0.9.e and 1.1.e over its entire surface area.

6. The chipless radiofrequency identification device as claimed in claim 1, characterized in that the conductive film layer thickness is greater than 100 nm.

7. The chipless radiofrequency identification device as claimed in claim 1, characterized in that the conductive film layer thickness is greater than 500 nm.

8. The chipless radiofrequency identification device as claimed in claim 1, characterized in that the conductive film layer thickness is less than 2 microns.

9. The chipless radiofrequency identification device as claimed in claim 1, characterized in that the conductive film layer is characterized by a surface resistance property of less than 1 ohm per square.

10. The chipless radiofrequency identification device as claimed in claim 1, characterized in that the printing product and the application film layer comprise a thermoplastic material.

11. The chipless radiofrequency identification device as claimed in claim 10, characterized in that the thermoplastic material of the application film layer is characterized by a glass transition temperature value "Tg" of between 40° C. and 80° C. and in that the thermoplastic material of the printing product is characterized by a Tg value of between 10 and 50° C.

12. The chipless radiofrequency identification device as claimed in claim 1, further comprising an interstitial layer comprising material of the printing product and material of the application film layer of the film.

13. The chipless radiofrequency excitation identification device as claimed in claim 1, wherein the conductive film layer thickness is less than 2.5 times a skin thickness at a given frequency, said skin thickness being able to be calculated using the formula $$\delta = \sqrt{\frac{2}{\omega\mu\sigma}} = \sqrt{\frac{2\rho}{\omega\mu}} = \frac{1}{\sqrt{\sigma\mu\pi f}}$$

where δ is the skin thickness in meters [m],
 f is the frequency of the current in hertz [Hz],
 ω is the angular frequency in radians per second [rad/s] (ω=2.π.f)
 σ is the electrical conductivity in siemens per meter [S/m]
 ρ is the resistivity in ohm-meters [Ω.m] (ρ=1/σ), and
 μ is the magnetic permeability in henries per meter [H/m], this permeability having the value 4σ10−7 for a vacuum.

14. The chipless radiofrequency excitation identification device as claimed in claim 13, characterized in that the excitation frequency is selected from a frequency band between 3 GHz and 10 GHz.

15. The chipless radiofrequency identification device as claimed in claim 1, characterized in that the conductive film layer thickness is less than 0.75 microns.

16. A method for manufacturing a chipless radiofrequency identification device including a multilayer composition comprising a substrate, the method comprising:
 a step of digitally printing a pattern on the substrate by printing a printing product comprising an ink, a varnish and/or a toner,
 followed by a step of selectively depositing a conductive film on the printed pattern through contact between the printing product and the application film layer of the conductive film comprising an application film layer in contact with the printing product and a conductive film layer, the conductive film configured to reflect a radiofrequency signature indicative of information coded on the chipless radiofrequency identification device only by resonant backscattering of the conductive film.

17. The method for manufacturing chipless radiofrequency identification devices as claimed in claim 16, characterized in that the step of digitally printing the pattern is performed through varnish/ink inkjet printing or through toner electrophotography (xerography) printing.

18. The method for manufacturing chipless radiofrequency identification devices as claimed in claim 16, characterized in that the RF signature of the radiofrequency identification device is controlled by selecting the shape of the conductive pattern and/or by selecting the type of printing product and/or by selecting the thickness of the printing product.

* * * * *